United States Patent [19]
Inoue et al.

[11] Patent Number: 5,977,823
[45] Date of Patent: Nov. 2, 1999

[54] SEMICONDUCTOR AMPLIFIER CIRCUIT

[75] Inventors: Akira Inoue; Seiki Gotou, both of Tokyo, Japan

[73] Assignee: Mitsubishi Denki Kabushiki Kaisha, Tokyo, Japan

[21] Appl. No.: 09/018,933

[22] Filed: Feb. 5, 1998

[30] Foreign Application Priority Data

Sep. 11, 1997 [JP] Japan ................................ 9-246527

[51] Int. Cl.⁶ .............................. G01R 19/00; H03F 3/16; H03K 5/08
[52] U.S. Cl. ............................... 330/2; 330/277; 327/325
[58] Field of Search ................................... 330/277, 296, 330/2; 327/430, 325

[56] References Cited

U.S. PATENT DOCUMENTS

| | | | |
|---|---|---|---|
| 3,911,293 | 10/1975 | Shafer | 307/236 |
| 4,683,443 | 7/1987 | Young et al. | 330/277 |
| 4,990,973 | 2/1991 | Ishikawa et al. | 330/277 |
| 5,050,235 | 9/1991 | Kojima | 330/277 |
| 5,430,409 | 7/1995 | Buck et al. | 330/2 |

FOREIGN PATENT DOCUMENTS 8139542  5/1996  Japan .

Primary Examiner—Robert Pascal
Assistant Examiner—Patricia T. Nguyen
Attorney, Agent, or Firm—Leydig, Voit & Mayer, Ltd.

[57] ABSTRACT

A semiconductor amplifier circuit receiving a high frequency signal and amplifying and outputting the signal includes a transistor for receiving the high frequency signal; and a waveform control connected to an input terminal of the transistor and controlling a negative value of the high frequency signal to be less than the gate breakdown voltage of the transistor and not below a negative threshold voltage. Therefore, a low distortion characteristic is available even when a transistor with a large magnitude of the gate breakdown voltage is manufactured. As a result, accuracy in controlling the value of the gate breakdown voltage during manufacturing is not required to be as high as in conventional manufacturing, resulting in a lower processing cost as well as improved yield.

15 Claims, 6 Drawing Sheets

SEMICONDUCTOR AMPLIFIER CIRCUIT

FIELD OF THE INVENTION

The present invention relates to a semiconductor amplifier circuit, more particularly, to a high-frequency amplifier circuit operating in a frequency band of several hundreds of megahertz (MHz) or more.

BACKGROUND OF THE INVENTION

FIG. 8 illustrates a circuit diagram of a prior art semiconductor amplifier. In FIG. 8, reference numeral 1 designates a field effect transistor (FET) such as an HEMT or MESFET. Numeral 2 designates an input matching circuit provided at the input side of the FET 1, and numeral 3 designates an output matching circuit provided at the output side of the FET 1. Numeral 4 designates a gate bias circuit provided at the input side of the FET 1, and numeral 5 designates a drain bias circuit provided at the output side of the FET 1.

In the circuit thus configured, the respective bias circuits 4 and 5 are electrically isolated by means of choke coils or λ/4 lines to prevent leakage of high frequency signals of magnitudes higher than several hundreds of megahertz to the bias circuits. Generally, amplifiers used for mobile communications have to maintain low distortion if an input power increases, and such amplifier is therefore designed such an that its input and output matching circuits 2 and 3 have characteristics of high power and high efficiency. To maintain low distortion, the FET 1 has to have a gate breakdown voltage ($V_{gdo}$) within a desired range.

More specifically, gate breakdown voltage (hereinafter also referred to as breakdown voltage) is generally preferred to be high, because low breakdown voltage allows a high current to flow through the gate, degrading reliability. In view of distortion, however, an FET having a high gate breakdown voltage, e.g., higher than the quadrature of a source voltage, has an inferior distortion characteristic. As is already known from experiments, a breakdown voltage ranging from double to the quadrature of a source voltage is preferred.

There are two reasons why high breakdown voltage causes inferior distortion.

1. Degradation of Distortion Due to Shifting of the Load Line

As shown in FIG. 9, it is known that when a gate breakdown voltage ($V_{gdo}$) is high, the negative amplitude of the waveform of the gate voltage $V_g$ of an FET is much greater than the positive one, which fact is described by Watanabe et al in IEICE Transacrions on Electornics, vol. E79-C, No.5, May, 1996, pp611–613, with detailed calculations.

$V_{gg}$ in the figure indicates a gate voltage when no signal is input, and is applied as a bias from an exterior source to obtain a constant voltage, as shown in FIG. 8. A dashed line 6 in FIG. 9 shows a waveform of a gate voltage $V_g$ when a small signal is input. This waveform is approximately symmetric, in the negative and positive directions, with respect to the gate voltage $V_{gg}$ when no signal is input. However, when the input power is increased, due to the nonlinearity of the FET, this waveform becomes asymmetric, in the negative and positive directions, with respect to the gate voltage $V_{gg}$ when no signal is input, as represented by a solid line 7 in the figure. In an FET having a high breakdown voltage, since the waveform in the negative direction of the gate voltage $V_{gg}$ when no signal is input is not clipped, the waveform has a negative amplitude greater than the positive one as shown in the figure. At this time, since a constant bias is applied such that average gate voltage/$V_g$=$V_{gg}$, the waveform of the gate voltage $V_g$ is wholly shifted in a positive direction to maintain the average value. Due to the shift, when an input power is high, a load curve at a drain side of the FET (which corresponds to a solid line 7 in FIG. 10) tends to be shifted upward, in comparison with the curve when the input power has a lower value (which corresponds to a dashed line 6 in the figure). That is, as shown in FIG. 10, gate voltage $V_g$ is shifted in the positive direction. Since the mutual conductance $g_m$ of an FET is generally not constant with respect to gate voltage $V_g$, that is, negative and positive values of a gate voltage $V_g$ are not equal, when the load line shifts with a change in input power as shown in FIG. 10, operations are performed in regions of different mutual conductances $g_m$, resulting in increased distortion.

On the other hand, since a low gate breakdown voltage of an FET causes waveform clipping for a negative value of a gate voltage, the negative amplitude of the gate waveform is not great as shown in FIG. 11, and the waveform becomes more symmetrical with respect to the gate voltage $V_{gg}$ when no signal is input. Therefore, a shift of the gate voltage $V_g$ for maintaining the division of an average gate value by gate voltage $V_g$ occurs less in comparison with the case shown in FIG. 9, the load line hardly shifts as shown in FIG. 12, and operations are performed in a region of same mutual conductance, minimizing increased distortion.

Nevertheless, a too low breakdown voltage causes excessive clipping of a gate voltage $V_g$, affecting symmetry of the waveform, and degrading reliability due to a high gate current as well. This means that there is an optimal range for breakdown voltage.

2. Amendment of Distortion by Changing Input Conductance

This is disclosed in IEEE Transactions On Microwave Theory and Techniques., vol 44, No. 12, December, 1996 by Yamada et al., with detailed calculations. FIG. 13 is a diagram illustrating a nonlinear equivalent circuit of Heterojunction Bipolar Transistor (HBT). In this HBT, main nonlinear parameters are a capacitance $C_{be}$ between the base and the emitter, an input conductance $g_{be}$ and an output conductance $g_{ce}$, and it is considered that the input conductance $g_{be}$ is has an effect on waveform clipping of an input-side waveform, and the output conductance $g_{ce}$ has an effect on waveform clipping of an output-side waveform. In the case of an FET, an input conductance $g_{be}$, an output conductance $g_{ce}$, and a capacitance $C_{be}$ between the base and the emitter can be regarded as a contribution to the effect of a waveform clipping caused by an input-side breakdown voltage and a resistance component. There is a further contribution from drain conductance obtained from drain-side waveform clipping, and nonlinearity of a capacitance $C_{gs}$ between gate and source of the FET, respectively. This means that a description of the HBT can be applied to the FET, too, and thus we will hereinafter describe a HBT used in the document quoted.

In the circuit shown in FIG. 13, a change of a phase passing from an input side to an output side $\Delta\Phi$ is calculated by following formula (1):

$$\Delta\Phi = \frac{\omega C_{ce} + B_1}{(g_{ce} + G_1)^2 + (\omega C_{ce} + B_1)^2}\Delta g_{ce} + \frac{\omega C_{be} + B_s}{(g_{be} + G_s)^2 + (\omega C_{be} + B_s)^2}\Delta g_{be} - \frac{g_{be} + G_s}{(g_{be} + G_s)^2 + (\omega C_{be} + B_s)^2}\omega\Delta C_{be} \quad (1)$$

If gain matching is performed at the input side, the numerator of the second term of the equation, $\omega C_{be}+B_s$, is zero and no contribution of $\Delta g_{be}$ is obtained. A low distortion semiconductor amplifier generally uses a method intending to improve distortion by making a value obtained by the matching at the input side different from the value as a result of gain matching. This corresponds to selecting $B_s$ in such a way that a phase change caused by $\Delta g_{ce}\omega$ and $\Delta C_{be}$ is canceled by $\Delta g_{be}$. More specifically, distortion is improved by reducing $\Delta\Phi$ using a change of conductance caused by waveform clipping at the input side. In applying this theory to an FET, it is not possible to improve distortion when the FET's breakdown voltage is too high, whereas improvement of distortion is possible when the breakdown voltage is low enough to cause clipping. This corresponds to a fact determined by experiment that, at an input level at which gain is compressed by 1 to 3 dB (about double or the quadrature of an operation source voltage), a breakdown voltage having a magnitude high enough to cause clipping is preferred.

As is known from the above-described two reasons, it does not follow that the higher a gate breakdown voltage ($V_{gdo}$) in an FET is, the better it is, rather a gate breakdown voltage within a desired range is required.

However, controlling breakdown voltage of an FET is generally difficult because the voltage depends on a recess geometry and a surface condition of the FET, causing low yield and increasing processing cost of semiconductor amplifiers.

There is another type of semiconductor power amplifier for receiving high frequencies and amplifying and outputting them, which is disclosed in Japanese Published Patent Application Number H8-139542. In this amplifier, to realize low distortion and high efficiency, a current circuit is provided at a gate input part of an amplification FET so as to supply a current of a magnitude corresponding to a power of an input signal to a bias circuit of the amplification FET. According to the techniques described in the patent document, since the current circuit employed comprises a Zener diode and its current-voltage characteristic is set such that a breakdown voltage is equal to a pinch-off voltage of the FET, it is possible to obtain gain in a wide range by moving bias points to new positions parallel to themselves such that they can maintain a sinusoidal waveform. This is, however, intended to obtain gain in a wide range without increasing distortion rather than to reduce distortion. Further, it is not normal for a GaAs type microwave circuit to comprise a Zener diode, and the above-described problems such as high processing cost are unavoidable for this circuit, too. That is, this circuit also cannot realize higher breakdown voltage and low distortion which are the goals for the present invention.

As described above, the conventional semiconductor amplifier circuit has the above configuration and must be designed so that a gate breakdown voltage ($V_{gdo}$) of an FET can be set within a desired range. However, manufacturing the FET so that its breakdown voltage is within a desired range is technically difficult, causing inferior yield.

SUMMARY OF THE INVENTION

An object of the present invention is to provide a semiconductor amplifier circuit including a transistor used for a high-frequency semiconductor amplifier circuit featuring high yield, high gate breakdown voltage, and low distortion.

Other objects and advantages of the present invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor amplifier circuit receiving high frequency and amplifying and outputting it, comprises: a transistor for receiving the high frequency; and a waveform control means being connected to the input of the transistor and controlling a waveform of a high frequency wave so that a negative value of the wave is less than a gate breakdown voltage of the transistor and not below a prescribed value. Therefore, low distortion characteristic is available even when a transistor with a large magnitude of the gate breakdown voltage is manufactured. As a result, control accuracy for controlling the value of the gate breakdown voltage in the manufacturing is not as high as that in the conventional manufacturing case, resulting in lower processing cost as well as improved yield.

According to a second aspect of the present invention, in a semiconductor amplifier circuit as defined in the first aspect, the waveform control means comprises a diode having an anode connected to the input of the transistor and a cathode connected to a ground. Therefore, it is possible to control a clipping voltage to a desired value with ease by adjusting a number of diodes to change a breakdown voltage.

According to a third aspect of the invention, in a semiconductor amplifier circuit as defined in the first aspect, the waveform control means comprises a transistor connected in parallel with the amplification transistor and has a gate breakdown voltage less than the gate breakdown voltage of the amplification transistor. Therefore, it is possible to reduce an area occupied by this waveform control means in comparison with the case where diode is used as a constituent of the waveform control means. Further, both of the transistors can be formed at the same time in the same process, which favors the whole manufacturing process.

According to a fourth aspect of the invention, in a semiconductor amplifier circuit as defined in the first or second aspect, a resistor is provided in series with the waveform control means. Therefore, it is possible to modify and optimize a clipping level for high-frequency signals with ease by adjusting, a current applied to the diode like a DC, to a desired value by means of the resistor.

According to a fifth aspect of the invention, in a semiconductor amplifier circuit as defined in the fourth aspect, a series circuit consisting of a resistor and a capacitor is provided in parallel with a resistor in series with the waveform control means. Therefore, it is possible to optimize a clipping level for high-frequency signals by adjusting the resistor included in the series circuit while adjusting a current applied to the diode like a DC to a desired value by means of the other resistor.

According to a sixth aspect of the invention, in a semiconductor amplifier circuit as defined in the first aspect, the waveform control means comprises a plurality of unit waveform shaping sections of different control values and, from the unit waveform shaping sections, a prescribed one is selected and used, such that a value of a voltage is adjusted in stages when the negative value of the high-frequency wave is controlled. Therefore, an optimal unit waveform shaping section can be selected for a characteristic of an amplification transistor even if the characteristic of the amplification transistor differs from a desired characteristic, thereby obtaining a low distortion semiconductor amplifier circuit and improving the yield of the semiconductor amplifier circuit as well.

According to a seventh aspect of the invention, in a semiconductor amplifier circuit as defined in any of the second to sixth aspects, a circuit as the waveform control means is formed within a semiconductor substrate where the amplification transistor is also formed. Therefore, it is possible to form the amplification transistor and the waveform control means at the same time within a single semiconductor device, thereby fabricating a smaller size of semiconductor device with lower processing cost in comparison with the case of assembling different semiconductor devices in modules.

DETAILED DESCRIPTION OF THE PREFERRED EMBODIMENTS

[Embodiment 1]

Figure 1:
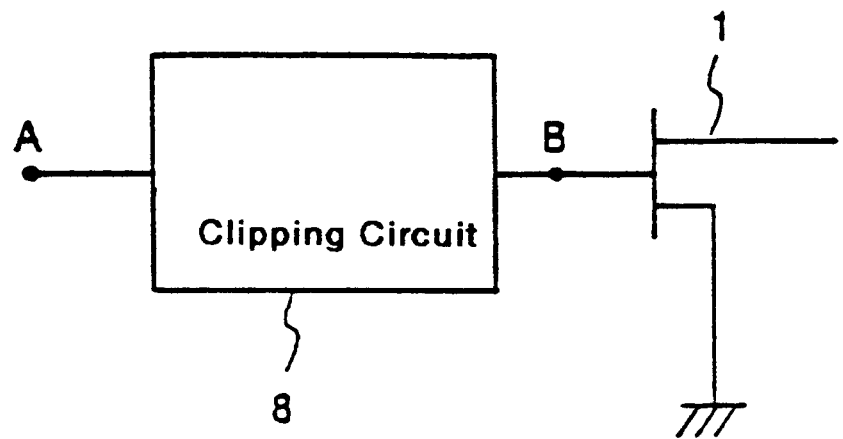
FIGS. 1(a) 1(b) 1(c) are diagrams illustrating structures representing high-level concepts for a semiconductor amplifier circuit according to a first embodiment of the present invention.
Figure 1:
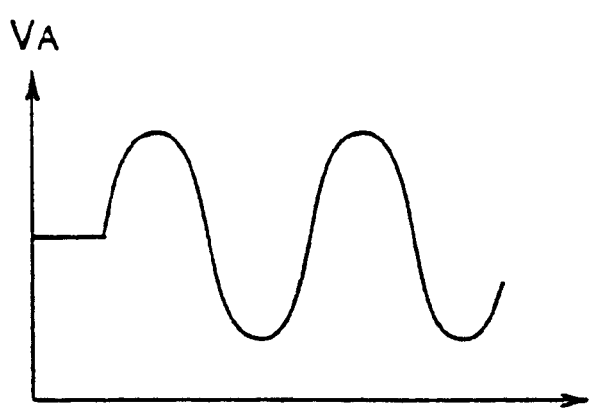
Figure 1:
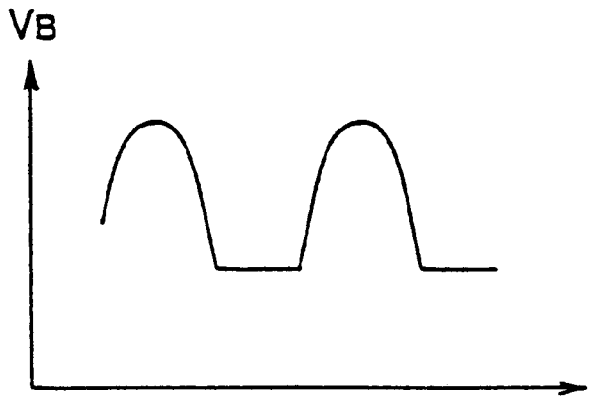

FIG. 1(a) is a diagram illustrating an equivalent circuit of a semiconductor amplifier according to a first embodiment of the present invention, and FIGS. 1(b) and 1(c) are waveform charts of the semiconductor amplifier of the first embodiment in operation. In FIG. 1(a), reference numeral 1 designates a field effect transistor (FET), numeral 8 designates a clipping circuit for clipping a negative amplitude of a gate voltage waveform of the FET 1, that is, fixing the value so that it does not become less than a prescribed value. Although in the figure input and output matching circuits and corresponding bias circuits are omitted, they are also arranged in the same manner as in the prior art devices and a matching circuit at input side may be used as a clipping circuit 8. Further, the operating point of the clipping circuit 8 is set such that this circuit can control the waveform of an input high-frequency power such that the negative value of the waveform is lower than a gate breakdown voltage of the FET 1 but not below a prescribed value.

Next, the effects will be described. According to a setting, the clipping circuit 8 at the gate input part of the FET 1 clips a gate waveform $V_A$ input to an input point A, which is shown in FIG. 1(b), to obtain a waveform $V_B$ shown in FIG. 1(c). By the use of the clipping circuit 8, a FET set to have a high breakdown voltage can prevent shifting of load curves and modifying distortion, thereby producing low distortion. Therefore, an FET which is hard to control with high accuracy can produce distortion characteristic as desired even when it is set to have a significantly high breakdown voltage. Thus a longstanding problem of degradation of yield associated with control of breakdown voltage of the FET is solved and the manufacturing cost of a semiconductor amplifier circuit is reduced. Further, the clipping operation prevents current from flowing to the gate of the FET 1, avoiding further degradation of the reliability of the FET 1.

Figure 2:
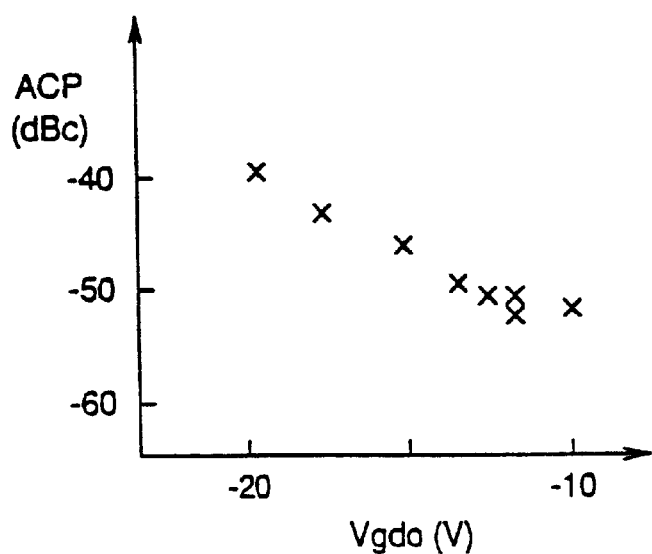
FIGS. 2(a) and 2(b) are graphs for explaining a relation between a gate breakdown voltage and a level of distortion in a semiconductor amplifier circuit according to the first embodiment including a clipping circuit.
Figure 2:
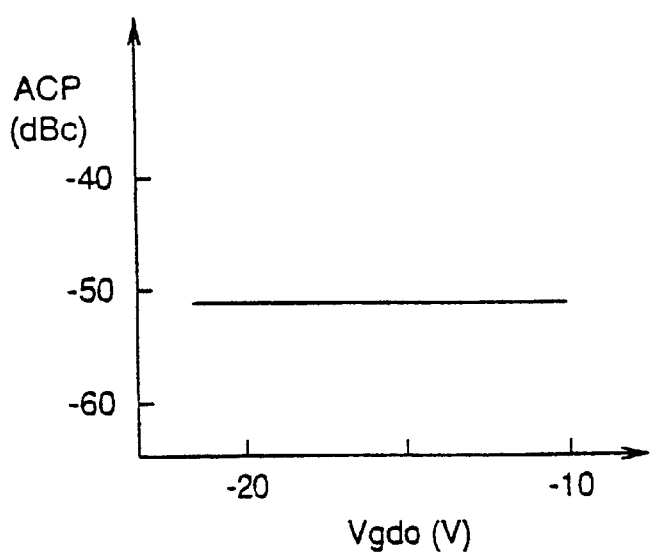

FIGS. 2(a) and 2(b) illustrate a relation between a magnitude of distortion and a gate breakdown voltage with an input frequency f of 950 MHz and π/4-shift QPSK-modulated signal. Adjacent channel leakage power (ACP) indicates a leakage power in adjacent channels displaced 50 KHz with respect to each other, and its standard is normally equal to or less than −48 dBc. In the prior art device, ACP is degraded with an increase in gate breakdown voltage and cannot meet the standard, as shown in FIG. 2(a); on the other hand, in the present invention, the use of a clipping circuit 8 enables APC to have a uniform value independent of the magnitude of the gate breakdown voltage.

According to the first embodiment of the invention, a waveform of a high-frequency input signal is controlled so that the magnitude of the negative value of the waveform is always below a gate breakdown voltage of an amplification FET 1 and does not exceed below a prescribed value in the negative direction. Therefore, a low distortion characteristic is obtainable even when an amplifier is manufactured on the assumption that the gate breakdown voltage of the FET 1 has a large value; as a result, accuracy in controlling gate breakdown voltage in the manufacturing is not as high as that in the conventional manufacturing, resulting in improved yield and reduced processing cost. In addition, flow of a current to the gate of the FET 1 can be prevented in clipping, resulting in improved reliability to the FET 1.
[Embodiment 2]

Figure 3:
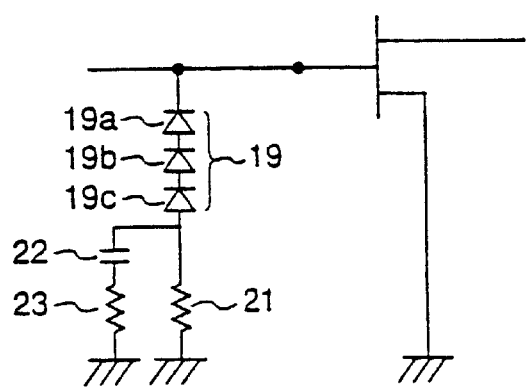
FIG. 3 is a diagram illustrating a concrete example of a semiconductor amplifier circuit according to a second embodiment of the present invention.

FIG. 3 illustrates an example of a clipping circuit 8 according to a second embodiment of the present invention which is a constituent of the semiconductor amplifier circuit according to the first embodiment. The circuit of the second embodiment features a configuration in which a clipping voltage is set by a plurality of diodes connected in series. In FIG. 3, reference numeral 19 designates a diode array consisting of plural diodes 19a, 19b, and 19c connected in series, with an anode connected to the gate input side of an FET 1 and a cathode connected to a ground side, and the cathode of the diode 19c is connected to a ground via a resistor 21. The resistor 21 is provided to change the clipping level by changing the magnitude of the element. Further, a series circuit consisting of a capacitor 22 and a resistor 23 is connected in parallel with the resistor 21. The resistor 21 modifies a current flowing through the diode array 19 while the resistor 23 modifies the clipping level so that it differs from a value of the current flowing through the diode array 19, thereby realizing a separate modification.

The above-described configuration takes advantage of a Schottky barrier of a diode; since the variation in breakdown voltage of this diode is as low as ±0.05 v in contrast with the variation in the breakdown voltage of the FET (±2 v), stable control of the clipping voltage is available.

Further, since not only the resistor 21 but the circuit consisting of the capacitor 22 and the resistor 23 are connected in series with the diode array 19, it is possible to modify to a desired value a current applied, like a DC voltage to the diode array 19 while adjusting the clipping level for high-frequency signals by means of the resistor 23.

Furthermore, this clipping circuit may be formed in the same procedure as that for the FET 1.

In addition, since the resistor 21 is connected in series with the diode array 19, the clipping level can be adjusted as desired by selecting the resistance of the resistor 21, obtaining a further low distortion characteristic.

Still further, if the gate metal width and thickness of the diode array 19 is set to be larger than the gate width and thickness of the FET 1 in the manufacturing clipping circuit, reliability can be ensured even if a clipping current flows through the diode array 19.

Although the second embodiment utilizes the configuration with the resistor 21 is connected in series with the diode array 19, this resistor 21 may be omitted.

[Embodiment 3]

Figure 4:
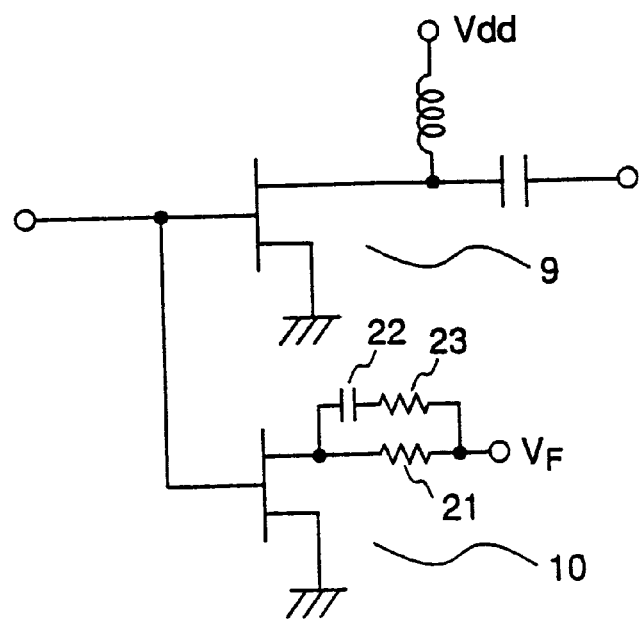
FIG. 4 is a diagram illustrating a concrete example of a semiconductor amplifier circuit according to a third embodiment of the present invention.

FIG. 4 illustrates another example of the clipping circuit according to a third embodiment of the invention which is a constituent of the semiconductor amplifying circuit according to the first embodiment. The clipping circuit of the third embodiment features a point that the gate of a high-breakdown-voltage amplification FET 9 is connected to a low-breakdown-voltage FET 10 with a lower gate breakdown voltage ($V_{gdo}$) than that of the FET 9 so that waveform clipping is performed due to the gate breakdown voltage ($V_{gdo}$) of the low-breakdown-voltage FET 10. Further, the drain of the low-breakdown-voltage FET 10 is connected not only to a resistor 21 but to a series circuit consisting of a capacitor 22 and a resistor 23 and that is connected in parallel with the resistor 21.

In this case, a reference voltage $V_F$ is applied to the drain of the low-breakdown-voltage FET 10, but this reference voltage may be of a same magnitude as a source voltage $V_{dd}$ of the circuit (VF=$V_{dd}$) and $V_F$=0 is acceptable. In this low-breakdown-voltage FET 10, avalanche breakdown can optimize a breakdown voltage preferentially if the high-frequency characteristic is sacrificed to optimize a recessed geometry of the FET, resulting in stable control of the breakdown voltage.

Further, a DC current in this low-breakdown-voltage FET 10 is adjusted to a desired value by the resistor 21 connected in series with the low-breakdown-voltage FET 10, whereas a clipping level is optimized by adjusting a value of the resistor 23, thereby obtaining still lower distortion characteristic.

Still further, both of the FETs 9 and 10 can be formed at one time in the same procedure, which is effective for the whole manufacturing process. In addition, these FETs occupy a smaller area in than the second embodiment where a plurality of diodes are used to adjust clipping voltage.

In the third embodiment, as in the other embodiments, a resistor 21 and a series circuit comprising a capacitor 22 and a resistor 23 are not necessarily required.

[Embodiment 4]

Figure 5:
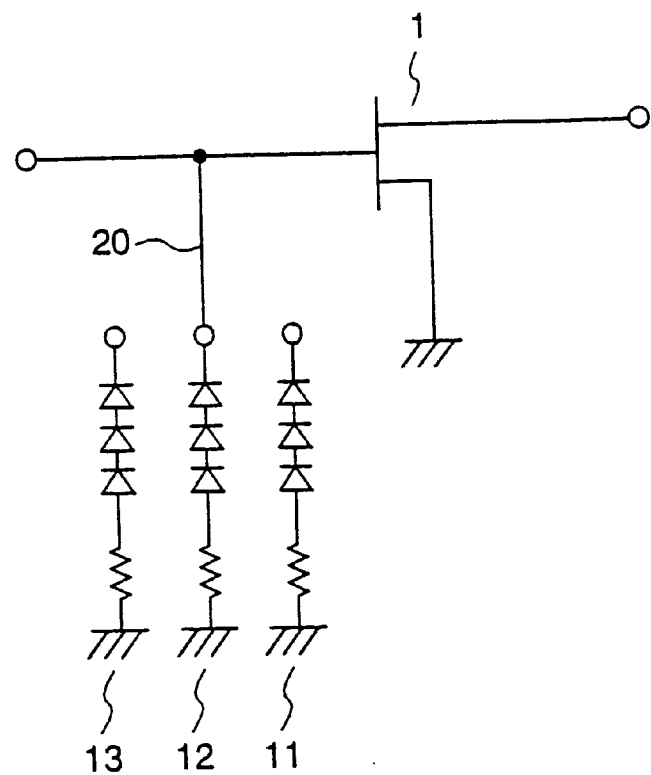
FIG. 5 is a diagram illustrating a concrete example of a semiconductor amplifier circuit according to a fourth embodiment of the present invention which includes a plurality of clipping circuits.

FIG. 5 illustrates an example of clipping circuit according to a fourth embodiment which is a constituent of the semiconductor amplifier circuit according to the first embodiment. The fourth embodiment features that clipping circuits 11, 12, and 13 of different clipping voltages and clipping levels are provided, each comprising the diode array 19 used in the second embodiment, and from these circuits, a prescribed one is selected and then connected electrically to the gate of the amplification FET 1.

To be more specific, the plural clipping circuits 11, 12, and 13 are circuits which differ from each other in the number of diodes and value of a resistor, and are configured such that one of the circuits is connected by means of a wiring 20. For example, incrementing or decrementing the number of diodes by 1 can vary the clipping voltage in a range of ±0.6 v. The wiring 20 is selectively formed by wire bonding or laser trimming.

The above configuration can implement a low-distortion semiconductor amplifier circuit by selecting an optimal clipping circuit from the clipping circuits 11 to 13, even if the FET 1 has a characteristic different from a desired one.

Further, for applications of different modulation modes, an optimal clipping circuit can be selected from the clipping circuits 11 to 13 by means of the wiring 20. Therefore, an optimal distortion characteristic is realized for each application and thus this amplifier circuit can correspond to various modulation modes.

In the fourth embodiment, a configuration is described in which diodes connected in cascade are used as clipping circuits 11 to 13, but other configurations using the elements shown in FIGS. 3 and 4 may be used.

[Embodiment 5]

Figure 6:
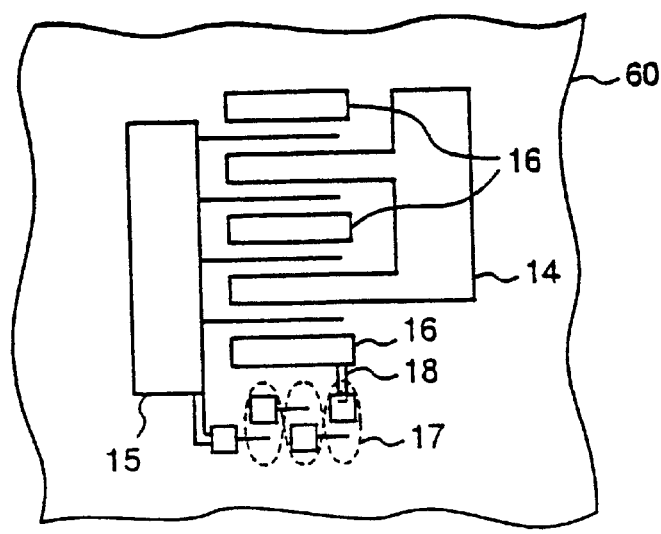
FIG. 6 is a top view of a semiconductor device according to a fifth embodiment of the present invention including a semiconductor amplifier circuit.

FIG. 6 is a top view of a semiconductor device when the clipping circuit of the second embodiment employed as a constituent of a semiconductor amplifier circuit is actually formed on a circuit substrate. In FIG. 6, reference numeral 60 designates a GaAs substrate, numeral 15 designates a gate electrode of an FET consisting of a WSi Schottky electrode and an Au conducting film with a width of about tens to hundreds of micrometers which is in contact with the electrode. In order to realize high-speed operation in microwave bands, the Schottky electrode has a dimension of 0.1~2 $\mu$m×20~50 $\mu$m. Reference numeral 14 designates a drain electrode comprising an Au conducting film and an electrode with a length of about tens to hundreds of micrometers which is in ohmic contact with the substrate 60, numeral 16 designates a source electrode having the same structure as the drain electrode 14. The respective sections are connected to each other under the substrate surface through via holes or connected by means of an air bridge. The interval between the drain electrode 14 and the source electrode 16 ranges from a few micrometers to hundreds of micrometers. Reference numeral 18 designates a resistor comprising an ion implanted resistor or a thin film metal resistor on the substrate 60, and this resistor is tens to hundreds of micrometers long. Reference numeral 17 designates a diode comprising a Schottky diode which has a Schottky barrier consisting of a metal body of the gate region of the FET. Since the above-described parts can be formed in a normal MMIC manufacturing process, respectively, the processing cost is approximately as high as that of the FET only.

Figure 7:
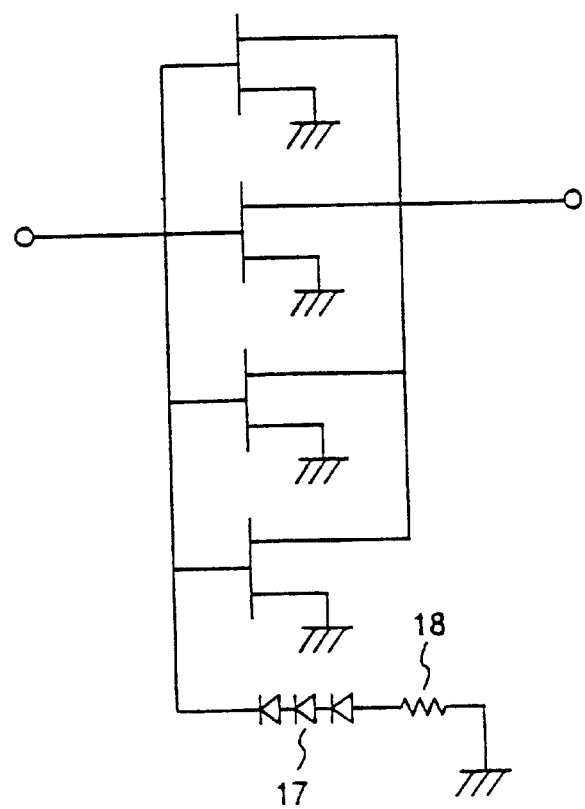
FIG. 7 is a diagram illustrating an equivalent circuit of a semiconductor device according to the fifth embodiment.
Figure 8:
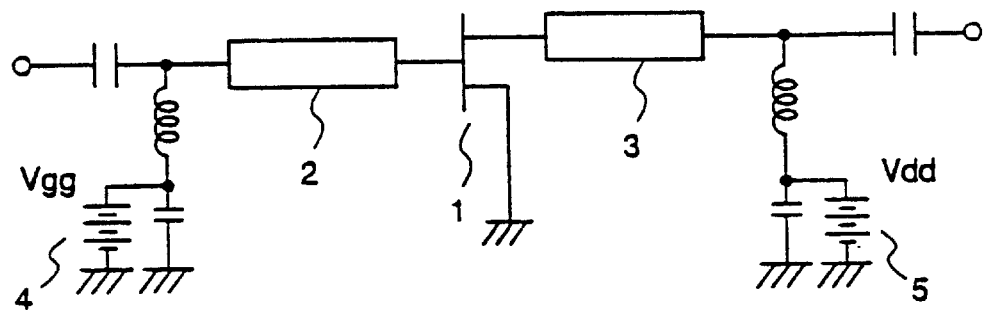
FIG. 8 is a diagram illustrating an equivalent circuit of a prior art semiconductor amplifier circuit.
Figure 9:
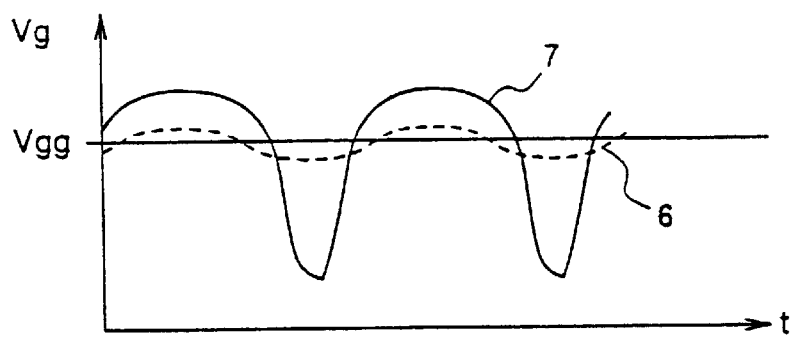
FIG. 9 is a waveform chart of a gate voltage $V_g$ of a high-breakdown-voltage FET.
Figure 10:
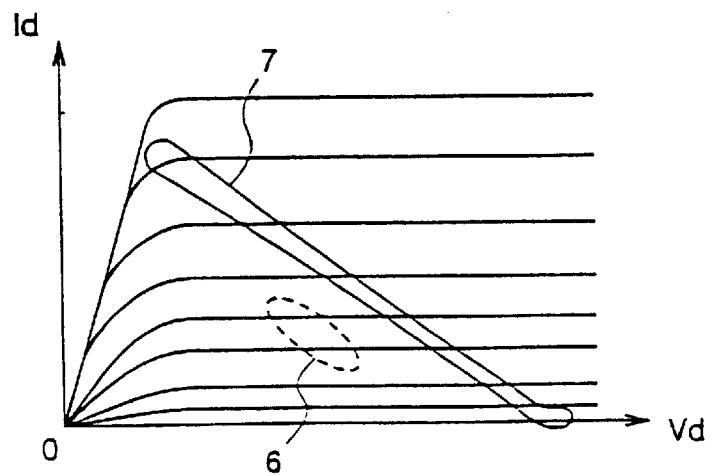
FIG. 10 is a diagram showing Id-Vd curves representing load curves of a high-breakdown-voltage FET.
Figure 11:
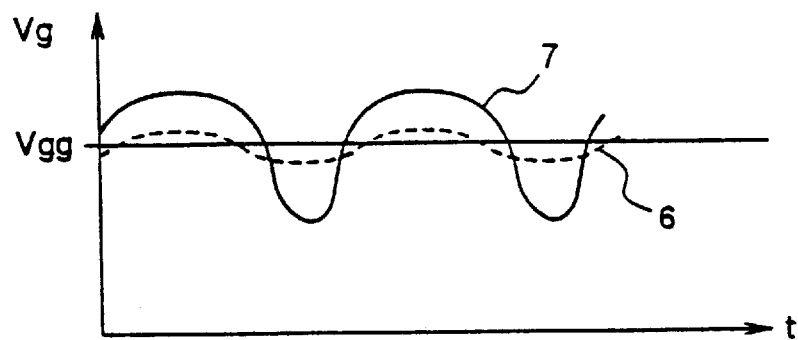
FIG. 11 is a waveform chart of a gate voltage $V_g$ of a low-breakdown-voltage FET.
Figure 12:
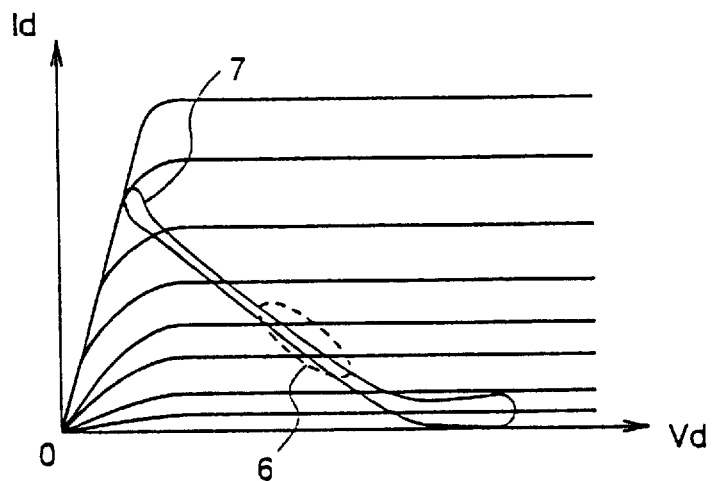
FIG. 12 is a diagram showing Id-Vd curves representing load curves of a low-breakdown-voltage FET.
Figure 13:
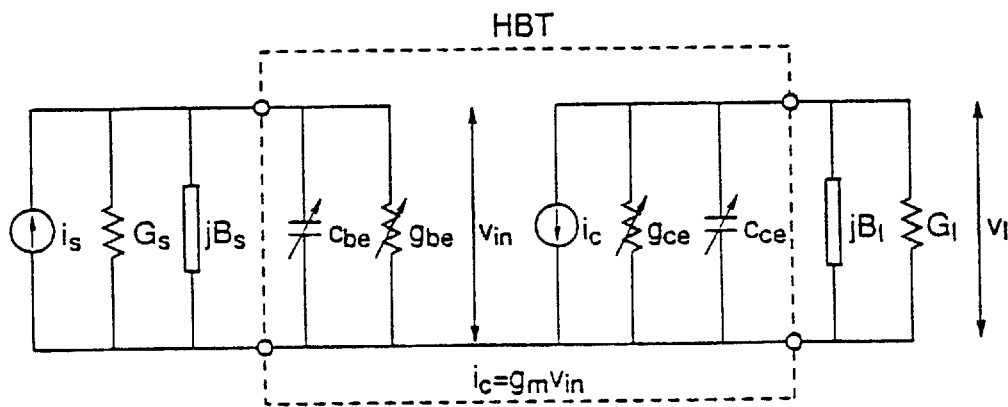
FIG. 13 is a diagram illustrating an equivalent circuit of a prior art semiconductor amplifier including an HBT.

FIG. 7 is a diagram illustrating an equivalent circuit of the semiconductor device shown in FIG. 6. In this circuit, a waveform clipping circuit consisting of diodes 17 and a resistor 18 is connected to the gate. Since the FET 1 and the clipping circuit can be formed at the same time within a single semiconductor device, this semiconductor device concerned can be manufactured less expensively than assembling different semiconductor devices in modules, and the size of the semiconductor device is smaller.

In the amplification FET, the input capacitance $C_{gs}$ is increased a little bit because the waveform clipping circuit is formed in the proximity of the amplification FET; however, an input side matching circuit (not shown) can be used without making substantial changes.

Further, in the clipping circuit, since a plurality of diodes (n diodes) are connected in series, an added capacitance is as small as $C_d/n$ where the capacity of one diode is $C_d$, and hence the effect on the input side matching circuit is small.

In any of the above embodiments, a field effect transistor (FET) is used as an amplifier, but a bipolar transistor such as an HBT may be employed if connected to a clipping circuit for optimizing distortion.

In the fifth embodiment, the clipping circuit of the second embodiment as a constituent of the semiconductor amplifier circuit is actually formed on a circuit substrate, the clipping circuits of the third and fourth embodiments can also be formed on the circuit substrate.

What is claimed is:

1. A semiconductor amplifier circuit for receiving a high frequency signal having an amplitude with positive and negative components that are positive and negative relative to each other and amplifying and outputting the high frequency signal as an amplified signal, said amplifier circuit comprising:

an amplification transistor for receiving and amplifying the high frequency signal; and waveform control means connected to an input terminal of the amplification transistor and clipping the negative component of the amplitude of the high frequency signal so that a negative amplitude of the high frequency signal received at the input terminal of the amplification transistor is lower in magnitude than a gate breakdown voltage of the amplification transistor and is not below a threshold negative voltage of the amplification transistor.

2. The semiconductor amplifier circuit as defined in claim 1 wherein the waveform control means comprises a diode having an anode connected to the input terminal of the amplification transistor and a cathode connected to a ground.

3. The semiconductor amplifier circuit as defined in claim 1 wherein the waveform control means comprises a transistor connected in parallel with the amplification transistor and having a gate breakdown voltage less than the gate breakdown voltage of the amplification transistor.

4. The semiconductor amplifier circuit as defined in claim 1 including a first resistor connected in series with the waveform control means.

5. The semiconductor amplifier circuit as defined in claim 2 including a first resistor connected in series with the waveform control means.

6. The semiconductor amplifier circuit as defined in claim 4 including a series circuit consisting of a second resistor and a capacitor, the series circuit being connected in parallel with the first resistor.

7. The semiconductor amplifier circuit as defined in claim 5 including a series circuit consisting of a second resistor and a capacitor, the series circuit being connected in parallel with the first resistor.

8. The semiconductor amplifier circuit as defined in claim 1 wherein the waveform control means comprises a plurality of unit waveform shaping sections having different control values and one of the unit waveform shaping sections is connected to the input terminal.

9. The semiconductor amplifier circuit as defined in claim 2 including a semiconductor substrate and wherein a circuit constituting the waveform control means is located on the semiconductor substrate with the amplification transistor.

10. The semiconductor amplifier circuit as defined in claim 3 including a semiconductor substrate and wherein a circuit constituting the waveform control means is located on the a semiconductor substrate with the amplification transistor.

11. The semiconductor amplifier circuit as defined in claim 4 including a semiconductor substrate and wherein a circuit constituting the waveform control means is located on the semiconductor substrate with the amplification transistor.

12. The semiconductor amplifier circuit as defined in claim 5 including a semiconductor substrate and wherein a circuit constituting the waveform control means is located on the semiconductor substrate with the amplification transistor.

13. The semiconductor amplifier circuit as defined in claim 6 including a semiconductor substrate and wherein a circuit constituting the waveform control means is located on the semiconductor substrate with the amplification transistor.

14. The semiconductor amplifier circuit as defined in claim 7 including a semiconductor substrate and wherein a circuit constituting the waveform control means is located on the semiconductor substrate with the amplification transistor.

15. The semiconductor amplifier circuit as defined in claim 8 including a series circuit consisting of a second resistor and a capacitor, the series circuit being connected in parallel with the first resistor.

* * * * *